United States Patent [19]

Toyomaki

[11] Patent Number: 5,027,119
[45] Date of Patent: Jun. 25, 1991

[54] NOISE SHAPING REQUANTIZATION CIRCUIT

[75] Inventor: Kazuya Toyomaki, Sagamihara, Japan

[73] Assignee: Victor Company of Japan, Ltd., Japan

[21] Appl. No.: 533,639

[22] Filed: Jun. 5, 1990

[30] Foreign Application Priority Data

Jun. 5, 1989 [JP] Japan .................................. 1-142346

[51] Int. Cl.⁵ .............................................. H03M 3/00
[52] U.S. Cl. ...................................... 341/144; 341/143; 341/94
[58] Field of Search ................. 341/143, 144, 122, 94, 341/116, 166, 140; 375/26, 33

[56] References Cited

U.S. PATENT DOCUMENTS

| 4,301,446 | 11/1981 | Petit | 341/143 |
|---|---|---|---|
| 4,467,291 | 8/1984 | Roza | 341/143 |
| 4,467,316 | 8/1984 | Musmann et al. | 341/144 |
| 4,536,880 | 8/1985 | Grallert | 341/143 |
| 4,541,102 | 9/1985 | Grallert | 341/143 |
| 4,593,398 | 6/1986 | Millar | 341/143 |
| 4,658,239 | 4/1987 | Grallert | 341/143 |
| 4,704,600 | 11/1987 | Uchimura et al. | 341/122 |
| 4,771,439 | 9/1988 | Okazaki et al. | 341/143 |
| 4,797,653 | 1/1989 | Takayama | 341/51 |
| 4,807,250 | 2/1989 | Tanaka | 341/143 |
| 4,812,815 | 3/1989 | Miyakoshi et al. | 341/144 |
| 4,849,758 | 7/1989 | Rosebrock | 341/143 |
| 4,853,780 | 8/1989 | Kojima et al. | 341/143 |
| 4,862,169 | 8/1989 | van Bavel et al. | 341/143 |
| 4,876,542 | 10/1989 | van Bavel et al. | 341/143 |

Primary Examiner—William M. Shoop, Jr.
Assistant Examiner—Helen Kim
Attorney, Agent, or Firm—Lowe, Price, LeBlanc & Becker

[57] ABSTRACT

In a noise shaping requantization circuit, a requantized output digital signal and an input digital signal are processed in an operational circuit whose output signal is requantized to provide the requantized output signal. The processing circuit can be configured in a variety of ways but has fixed limitations established for circuit parameters which determine the relationship between the output signal therefrom and the two input signals. By comparison with prior art noise shaping requantization circuits, a substantially better S/N ratio (assuming equal values of output signal resolution), or a substantially lower degree of output signal resolution (assuming equal values of S/N ratio) can be achieved, with stable operation.

2 Claims, 4 Drawing Sheets

NOISE SHAPING REQUANTIZATION CIRCUIT

BACKGROUND OF THE INVENTION

Field of Applicable Technology

The present invention relates to a noise shaping requantization circuit for use in converting a digital signal to an analog signal by employing a low resolution digital/analog converter. Such a requantization circuit functions by requantizing the digital signal to convert it to a digital signal having a lower degree of resolution, with the requantization being executed such that the frequency distribution of the resampling noise that is generated in the requantization process is shaped such as to shift the noise components to a high frequency range, thereby effectively increasing the signal-to-noise ratio of the output digital signal.

Noise shaping quantization methods for use in achieving a high accuracy of D/A conversion operation are now well known, whereby an input digital signal (originally generated by sampling of an analog signal at an original sampling frequency which is higher than the minimum, i.e. Nyquist sampling frequency) is resampled and requantized using a resampling frequency that is substantially higher than the original sampling frequency (i.e. oversampling is executed) and using a requantization step size that is substantially larger than the original quantization step size of the input digital signal (i.e. a lower degree of resolution is used than that used to derive the original digital signal) In general, negative feedback is applied, to produce a differential characteristic for the amplitude/frequency spectrum of the quantization error noise that is generated as a result of that sampling operation. As a result, in effect the quantization noise contained in the output digital signal is shifted outside the desired signal frequency range, and the level of quantization noise within the desired signal frequency range is reduced. The resampled output digital signal is then converted to analog form by a D/A conversion section. Due to the large step size, i.e. low resolution of the requantization, this D/A conversion section can have a very simple configuration and provide very high conversion accuracy.

A D/A converter based on such a noise shaping requantization circuit is used in two basic types of application, i.e. for D/A conversion or for A/D conversion. In the case of D/A conversion, an original input digital signal is resampled as described above, and the resultant requantized output digital signal is supplied to a D/A conversion section, to be converted to analog form. In the case of A/D conversion, an original analog signal is sampled at an original sampling frequency (i.e. at least higher than the Nyquist frequency for the input signal frequency range), and the resultant output digital signal is then inputted to an internal noise shaping requantization circuit, to obtain a requantized digital signal which is then transferred through an internal D/A conversion section to obtain an analog signal which is fed back to the input such as to form a negative feedback loop. The accuracy of the output digital signal is thereby increased.

In the case of an A/D converter which incorporates such an internal digital/analog converter for negative feedback purposes, the oversampling technique enables the internal configuration to be made very simple, since the internal D/A conversion can have a very low degree of resolution (e.g. with a total of only two or three quantization steps). This serves to eliminate any problems of linearity errors in the internal D/A conversion, and makes it unnecessary to perform adjustment or trimming of the circuit. In addition, such a configuration can readily be adapted to implementation in integrated circuit form.

Similar advantages are obtained when such a noise shaping quantization method is applied to a digital/analog converter for producing an output analog signal from an original digital signal. Here again a quantized output digital signal having a lower degree of resolution than the input digital signal (i.e. larger quantization step size) can be produced, which can then be subjected to digital-to-analog conversion by a low-resolution digital/analog converter, to obtain the desired output analog signal. Hence, the overall digital/analog converter can be easily realized in integrated circuit form.

The advantage is also obtained that a simple digital/analog converter section having low resolution but a very high degree of linearity, such as a PWM (pulse width modulation) type of digital/analog converter circuit can be used to convert the requantized digital signal to analog form with a very high degree of accuracy.

For these reasons, various types of noise shaping quantization methods have been developed in recent years, and are now known in the art.

Figure 1A:
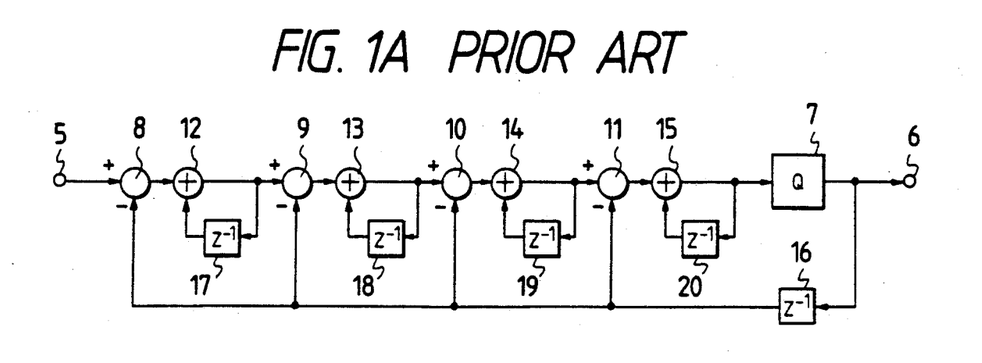
FIGS. 1A and 1B are block diagrams showing respective general configurations of examples of prior art noise-shaping requantization circuits.

FIG. 1A is a block diagram of a prior art noise shaping requantization circuit (referred to in the following simply as a requantization circuit), which utilizes a method of requantization that is a development of the delta-sigma method. The circuit of FIG. 1A provides a fourth order noise shaping characteristic. In FIG. 1A, numeral 5 denotes an input terminal of an input digital signal $X(z)$, 7 denotes a requantizer for converting the input digital signal to an output signal $Y'(z)$ having a lower degree of resolution than the input digital signal, 6 denotes an output terminal for transferring an output signal produced from the requantizer 7, 8 to 11 denote subtractors, 12 to 15 denote adders. 16 to 20 denote delay elements each of which provides a unit delay that is equal to one resampling period.

Figure 1B:
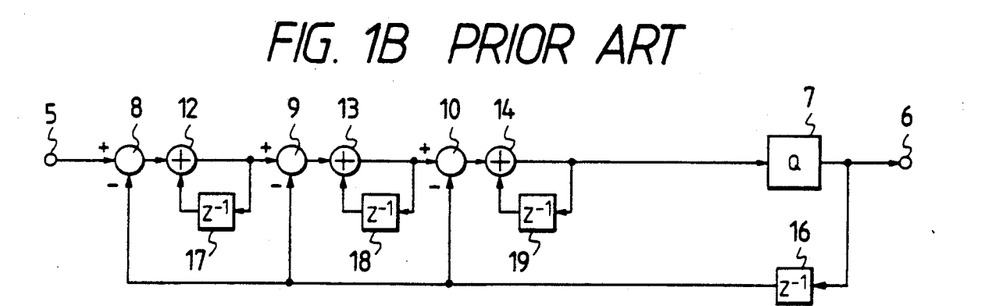

The requantization circuit of FIG. 1A provides a fourth order noise shaping characteristic as stated above. However if subtractor 11, adder 15 and delay element 20 in FIG. 1A are removed, and the output signal from the adder 14 applied directly to the requantizer 7, then the circuit will provide a third order noise shaping characteristic. Such a prior art requantization circuit for providing a third order noise shaping characteristic is shown in FIG. 1B, and will be referred to in the following as the prior art example No. 1. The requantization circuit of FIG. 1A, which provides a fourth order noise shaping characteristic, will be referred to in the following as the prior art example No. 2.

In the following, all signals will be expressed in z-plane form, based on the resampling period, which corresponds to a delay operator that is designated in the following as $z^{-1}$. Such a manner of expressing signals consisting of successive samples is now widely utilized. With the requantization circuit of FIGS. 1A, 1B designating the requantization error of the low resolution converted output from the requantizer 7 as $N(z)$, designating the input signal to the requantizer 7 as $A'(z)$, and designating the output signal from the requantization circuit as $Y'(z)$, then the following is true:

ti $Y'(z) = A'(z) + N(z) \ldots$ (1)

In addition, the relationship between the input signal A'(z) of the requantizer 7 and the output signal Y'(z) of the requantization circuit is given by the following equation (2):

$$A'(z) = \frac{X(z)}{(1 - z^{-1})^K} + \frac{(1 - z^{-1})^K - 1}{(1 - z^{-1})^K} \cdot Y'(z) \quad (2)$$

In the above, K is a natural number. With the prior art example No. 1, K=3, while with the prior art example No. 2, K=4.

The input signal A'(z) of the requantizer 7 and the output signal Y'(z) from the requantization circuit, given by the equations (1) and (2) above, can be expressed by the following equations (3) and (4) respectively:

$$A'(z) = X(z) + \{(1-z^{-1})^K - 1\} \cdot N(z) \ldots \quad (3)$$

$$Y'(z) = X(z) + (1-z^{-1})^K \cdot N(z) \ldots \quad (4)$$

As is known in the art, the term $((1-z^{-1}))^K$ provides a differential characteristic, whereby gain varies in proportion to frequency such that the amplitude of the quantization error (quantization noise) components of the output signal expressed by equation (4) will be reduced in accordance with lowering of frequency. That is to say, the desired noise shaping characteristic is exhibited. The factor K in the above equations expressed the order of the noise shaping circuit.

The requantization circuit of the prior art example No. 1 exhibits a third order noise shaping characteristic, while the requantization circuit of the prior art example No. 2 exhibits a fourth order noise shaping characteristic.

With a requantization circuit, as will be clear from the above equation (4), the greater the value of K (i.e. the higher the order of the circuit), the greater will become the improvement that is provided in the signal-to-noise ratio within the signal frequency range.

On the other hand, as can be seen from equation (3) above, the higher the value of K, the greater will become the level of the input signal A'(z) of the requantizer 7. That is to say, assuming that the quantization step size of the requantizer 7 is 2P (where P is an arbitrary natural number), and also assuming that the requantizer 7 is not driven into saturation (i.e. that the requantization error N(z) will always be within the range ±P), then the range of the requantization error N(z) is expressed as follows:

$$-P \leq N(z) \leq P \ldots \quad (5)$$

Moreover, from equation (3) above, the following can be expressed:

$$-(2^K-1) \cdot P \leq \{A'(z) - X(z)\} \leq \{(2^K-1) \cdot P\} \ldots \quad (6)$$

The above relationship (6) signifies that the limits of the input signal A'(z) of the requantizer 7 are widened with respect to the limits of the input signal X(z), by the amount $\pm(2^K-1) \cdot P$, and hence, the higher is the order K, the greater will become the level of the input signal A'(z) of the requantizer 7, and hence, the greater will become the necessary number of output steps of the requantizer 7 (i.e. the higher will become the necessary degree of resolution). For example the limits of the input signal A'(z) of the requantizer 7 are wider than the limits of the input digital signal by the amount ±7P, in the case of the prior art example No. 1, while the limits of the input signal A'(z) of the requantizer 7 are wider than the limits of the input digital signal by the amount ±15P, in the case of the prior art example No. 2. Hence, the required degree of resolution of the requantizer 7 must be accordingly increased.

The above points signify that the resolution of the digital/analog converter which receives the output signal of the requantization circuit must be increased in accordance with an increase of the order K of the requantization circuit. Hence, this counteracts the basic objective of using such a requantization circuit, which is to enable a reduction of the required degree of resolution of the digital/analog converter that is connected to receive the output digital signal from the requantization circuit.

For example if a PWM (pulse width modulation) type of digital/analog converter is used as the digital/analog converter that is supplied with the output signal from the requantization circuit, then if the degree of resolution that is necessary for that digital/analog converter is increased, the clock frequency of the digital/analog converter must be accordingly increased. This will lead to various practical problems, and so is basically, undesirable. For example, as a result of the need to generate a higher frequency of clock signal, it is difficult to use an inexpensive type of oscillator vibrator element for generating the clock signal, and it is also necessary to use circuit elements which can function at higher frequencies, in order to prevent any reduction of conversion accuracy. Thus, various problems will arise with regard to practical realization of such prior art types of noise shaping requantization circuit.

SUMMARY OF THE INVENTION

It is an objective of the present invention to overcome the disadvantages of the prior art as set out above, by providing a noise shaping requantization circuit for converting an input digital signal having a high degree of resolution to a requantized output digital signal having a lower degree of resolution, using a resampling frequency that is higher than an original sampling frequency of the input digital signal, which is characterized in that, designating the input digital signal as X(z), the requantized output signal as Y(z), and the unit delay time corresponding to the resampling period as $z^{-1}$, the noise shaping requantization circuit comprises an operational circuit which receives the input digital signal X(z) and the requantized output signal Y(z) and generates an output signal which is expressed by the following:

$$X(z) + z^{-1} \left\{ \frac{b}{1 - z^{-1}} + \frac{c}{(1 - z^{-1})^2} + \frac{d}{(1 - z^{-1})^3} + \frac{e}{(1 - z^{-1})^4} \right\} \{X(z) - Y(z)\}$$

where the respective constants b, c, d and e simultaneously satisfy all of the following relationships:

$b \geq \frac{1}{2}, e \geq 0, d+e > 0$ $b(d+e)(c+d+e) - b^2 e - 1.2(d+e)^2 > 0$ $8b+4c+2d+e<15$ $8b+4c+2d<14+e$ and further comprises a requantizer which receives the output signal from the operational circuit and thereby generates the requantized output signal. Such a noise shaping requantization circuit according to the present invention converts an input digital signal having high resolution into a requantized output signal having a lower degree of resolution, by using a resampling frequency that is higher than the original sampling frequency of that input digital signal, and provides a substantially improved performance by comparison with prior art types of noise-shaping requantization circuit.

Specifically, if a prior art type of noise shaping requantization circuit and an noise shaping requantization circuit according to the present invention are respectively configured to provide a mutually identical degree of signal/noise ratio improvement (i.e. improvement that is made possible by the noise shaping operation), then the noise shaping requantization circuit of the present invention can function with a substantially lower degree of output resolution than the prior art noise shaping requantization circuit. That is to say, a larger requantization step size can be utilized with the noise shaping requantization circuit of the present invention, which is basically advantageous as described hereinabove.

Conversely, if a noise shaping requantization circuit according to the present invention and a prior art type of noise shaping requantization circuit are configured such as to operate with ar identical value of output resolution (requantization step size), then the noise shaping requantization circuit of the present invention will provide a substantially greater degree of S/N improvement than the prior art circuit.

DESCRIPTION OF PREFERRED EMBODIMENTS

Figure 2:
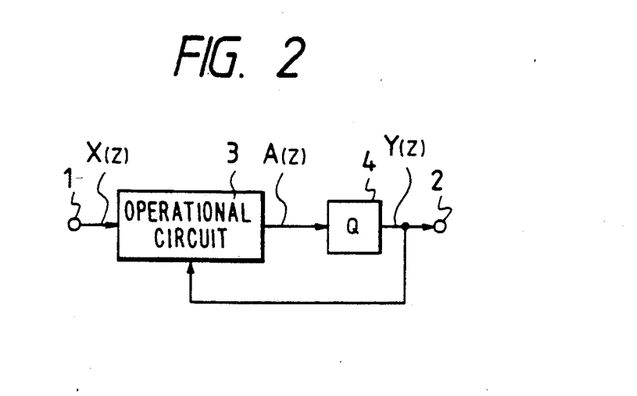
FIG. 2 is a block diagram showing the general configuration of a noise shaping requantization circuit according to the present invention.

A detailed description will be given in the following of specific configurations for a noise shaping requantization circuit according to the present invention, referring to the drawings. FIG. 2 is a block diagram showing the general configuration of a noise shaping requantization circuit according to the present invention, for converting an input digital signal having a high degree of resolution to a requantized output digital signal having a lower degree of resolution, by using a resampling frequency that is higher than the original sampling frequency of the input digital signal. Numeral 1 denotes an input digital signal input terminal, 2 denotes a noise shaping requantization circuit output terminal, 3 denotes an operational circuit, and 4 denotes a requantizer.

Specific examples of configurations of the operational circuit 3 are shown in FIGS. 4 to 9 and will be described in detail hereinafter.

With the noise shaping requantization circuit according to the present invention of FIG. 2 an input digital signal X(z) applied to the input terminal 1 is inputted to the operational circuit 3 as is also a requantized output digital signal Y(z which is outputted from the requantizer 4. The operational circuit 3 operates on these input signals such as to produce an output digital signal A(z), which is expressed as:

$$X(z) + z^{-1} \left( \frac{b}{1-z^{-1}} + \frac{c}{(1-z^{-1})^2} + \frac{d}{(1-z^{-1})^3} + \frac{e}{(1-z^{-1})^4} \right) \{X(z) - Y(z)\} \quad (11)$$

where the respective constants b, c, d and e simultaneously satisfy all of the following relationships $$b \geq \tfrac{1}{2}, e \geq 0, d+e > 0 \ldots \quad (7)$$

$$b(d+e)(c+d+e) - b^2 e - 1.2(d+e)^2 > 0 \ldots \quad (8)$$

$$8b + 4c + 2d + e < 15 \ldots \quad (9)$$

$$8b + 4c + 2d < 14 + e \ldots \quad (10)$$

The requantizer 4 converts the output signal A(z) produced from the operational circuit 3 to the requantized output signal Y(z), which has a lower degree of resolution, and supplies the requantized output digital signal Y(z) to the output terminal 2.

The essential features of a noise shaping requantization circuit according to the present invention will be described in the following referring to FIG. 2. In particular the stability, degree of signal-to-noise ratio improvement, and necessary level of output resolution will be successively described.

Firstly, the stability will be described, as follows. The output signal from the operational circuit 3, i.e. the input signal A(z) of the requantizer 4, is given by the aforementioned expression (11), $$\text{i.e. } A(z) = \text{expression (11)} \ldots \quad (12)$$

Designating the requantization error which accompanies the process of conversion to a lower degree of resolution by the requantizer 4 as N(z), the requantized output signal Y(z) can be expressed by the following equation (13):

$$Y(z) = A(z) + N(z) \ldots \quad (13)$$

Since the noise shaping requantization circuit is configured as a negative feedback loop, the following can be derived from the equations (12) and (13)

$$A(z) - X(z) = \frac{G(z)}{1 + G(z)} \{-N(z)\} \quad (14)$$

The factor G(z) in equation (14) is expressed by the following equation (15):

$$G(z) = z^{-1}\left( \frac{b}{1-z^{-1}} + \frac{c}{(1-z^{-1})^2} + \frac{d}{(1-z^{-1})^3} + \frac{e}{(1-z^{-1})^4} \right) \quad (15)$$

G(z) expresses a recursive type of transfer characteristic. In the frequency (jω) domain, designating T as the resampling period, $$z^{-1} = e^{-j\omega T} = \cos\omega T - j\sin\omega T \ldots \quad (16)$$

By inserting the above into the equation (15) the following can be obtained:

$$G(j\omega) = R(\omega) + J \cdot I(\omega) \ldots \quad (17)$$

where:

$$R(\omega) = -\frac{b}{2} - \frac{c}{2(1-\cos\omega T)} - \frac{d}{4(1-\cos\omega T)} + \frac{e \cdot \cos\omega T}{4(1-\cos\omega T)^2} \quad (18)$$

$$I(\omega) = \frac{d + e - 2(1-\cos\omega T) \cdot b}{4(1-\cos\omega T)^2} \cdot \sin\omega T \quad (19)$$

The aforementioned relationship (7), i.e.

$$b \geq \tfrac{1}{4},\ e \geq 0,\ d+e < 0 \ldots \quad (7)$$

results in the following being true:

$$0 > \omega \leq \pi/T \ldots \quad (20)$$

Figure 3:
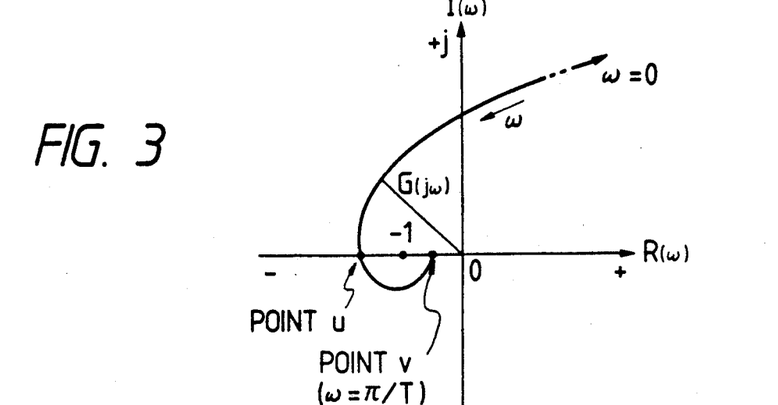
FIG. 3 is a diagram for describing a stability characteristic of a noise shaping requantization circuit according to the present invention.

The limits of the value ω, expressed by the relationship (20), can be expressed as a vector path which is traced out by G(jω), as shown in FIG. 3. The vector path in the range $\pi/T \leq \omega < 2\pi/T$ is obtained by folding over the vector path in the range $0 < \omega \leq \pi/T$ about the real axis. In addition, the vector path in the range $2K\pi/T < \omega < 2(k+1)\pi/T$, where K is a natural number, is obtained by folding over the vector path in the range $0 < \omega < 2\pi/T$, Thus it is possible to perform analysis by using only the range of $0 < \omega \leq \pi/T$.

Examining the aforementioned equation (19), using the conditions set by the expressions (7) and (20), it is found that there are two points for which I(ω)=0, i.e. two points at which the vector path intercepts the real axis. In FIG. 3, the two points at which the vector path intercepts the real axis are designated as the point u and the point v.

In FIG. 3, of the two points u and v for which I(ω)=0 as stated above, the value of is smaller for the point u. At the point u, the relationship d+e=2(1-−cosωT)·b is true, i.e.:

$$\cos\omega T = \frac{2b - d - e}{2b} \quad (21)$$

At the point v, i.e. the point where sinωT=0, i.e. ω=π/T, $$\cos\omega T = -1 \ldots \quad (22)$$

The stability of a feedback control system is determined by the position relationships between these two points for which I(ω)=0, i.e. the two points at which the vector path intersects the real axis, and the boundary points (−1, j0) of the control system. However, as is well known in the art, the control system will be stable if the point u lies on the real axis at a position which is more negative than −1, and if the point v lies on the real axis at a position which is more positive than −1, i.e. if there is a boundary point at the left side of the vector path, as increases.

Alternatively stated, designating the R(ω) value of the point u as Ru, and that of the point v as Rv, the necessary conditions for stability of a control system are that both of the following relationships are satisfied:

$$Ru < -1 \ldots \quad (23)$$

$$Rv > -1 \ldots \quad (24)$$

From the aforementioned equations (18) and (21), Ru can be obtained as:

$$Ru = \frac{b}{(d+e)^2} \cdot \{b \cdot e - (d+e)(c+d+e)\} \quad (25)$$

In addition, from the equations (18) and (22) above, $$Rv = -\frac{b}{2} - \frac{c}{4} - \frac{d}{8} - \frac{e}{16} \quad (26)$$

Thus, from equations (23), 25), the following condition is obtained for the point u:

$$\frac{b}{(d+e)^2} \cdot \{b \cdot e - (d+e)(c+d+e)\} < -1 \quad (27)$$

And, from equations (23), 25), the following condition is obtained for the point v:

$$-\frac{b}{2} - \frac{c}{4} - \frac{d}{8} - \frac{e}{16} > -1 \quad (28)$$

If both of the above conditions (27) and (28) are satisfied, then stability of the control system is ensured. With the present invention, from considerations of ensuring a practical level of stability, a sufficient margin is left to ensure that the maximum value Mp of the open-loop transfer characteristic gain M will not become excessively high, where M is expressed as:

$$M = \left| \frac{G(j)}{1 + G(j)} \right| = \frac{\sqrt{\{R(1+R) + I^2\}^2 + I^2}}{(1+R)^2 + I^2} \quad (29)$$

(in which R=R(ω), and I=I(ω))

This margin is ensured by the following conditions:

$$Ru < -1.2 \ldots \quad (30)$$

$$Rv > -(15/16) \ldots \quad (31)$$

From the above relationships (25), (30) and (26), (31), the previously stated relationships (8) and (9) are obtained, i.e.

$$b(d+e)(c+d+e) - b^2 e - 1.2(d+e)^2 > 0 \ldots \quad (8)$$

$$8b + 4c + 2d + e < 15 \ldots \quad (9)$$

In the case of the point v, an even greater margin of stability is ensured, for the case of $e < \frac{1}{2}$, by setting the condition:

$$Rv > -\frac{(7 + e)}{8} \quad (32)$$

Thus, from the above relationships (26) and (32), the aforementioned relationship (10) can be obtained, i.e.

$$8b + 4c + 2d < 14 + e \ldots \quad (10)$$

Designating the closed loop transfer gain at the point v (i.e. the point where $\omega = \pi/T$) as Mf, this is obtained as follows, based on the relationships (26) and (29):

$$Mf = \left| \frac{Rv}{1 + Rv} \right| = \left| \frac{8b + 4c + 2d + e}{16 - (8b + 4c + 2d + e)} \right| \quad (33)$$

The above value Mf, i.e. the closed loop transfer gain at the point v (i.e. the point where $\omega = \pi/T$) will be compared with that obtained by using the prior art examples, as follows. In the case of the prior art example No. 1, the value of Mf will be designated as $Mf|_1$. Inserting the expression (33) into the equation (82) which is given hereinafter, the following is obtained:

$$Mf|_1 = 7 \ldots \quad (34)$$

If a noise shaping requantization circuit according to the present invention is configured with $e = 0$, to provide a third-order noise shaping characteristic, as for the prior art example No. 1, then designating the value of Mf in this case as $Mf|_{e=0}$, then from the relationships (10) and (33) the following are obtained:

$$Mf|_{e=0} < 7 \ldots \quad (35)$$

Designating the value of Mf that is obtained for the prior art example No. 2 as $Mf|_2$, then the following can be obtained by inserting the relationship (33) into the equation (33) which is given hereinafter:

$$Mf|_2 = 15 \ldots \quad (36)$$

If a noise shaping requantization circuit according to the present invention is configured to provide a fourth order noise shaping characteristic, as for the prior art example No. 2, by setting the value $e > \frac{1}{2}$, then designating the value of Mf that is obtained in this case as $Mf|_{e > \frac{1}{2}}$, the following can be obtained from the relationships (9) and (33):

$$Mf|_{e > \frac{1}{2}} < 15 \ldots \quad (37)$$

With each of the prior art example No. 1 and prior art example No. 2, the value of Mf is always equal to the maximum value Mp (i.e. Mp = Mf).

Thus as described in the above, with a noise shaping requantization circuit according to the present invention the value of Mf is smaller than that which can be achieved with the previously described prior art examples. That is to say, a greater margin of stability (as determined by the position of the point v) is obtained than is possible with the prior art examples.

Designating the value of M at the point u as Mu, this is obtained from the aforementioned equation (8) as follows:

$$Mu = \left| \frac{Ru}{1 + Ru} \right| < 6 \quad (38)$$

The reason for making the value of the closed loop transfer gain small is that this inherently results in increased stability of the loop. However at the same time, this results in a reduction of respective internal signal levels within the noise shaping requantization circuit, and in particular leads to a reduction of the level of the input signal that is supplied to the requantizer, so that it also provides a desirable effect with regard to the necessary degree of signal-to-noise ratio improvement of the requantizer. This point will be described in greater detail in the following.

Firstly, the condition $b \leq \frac{1}{2}$ that is given by the relationship (7) above for a precondition of the present invention will be discussed. Basically, the necessary condition for stability of a control system is that $b > 0$, and also the conditions given by relationships (7), i.e. $e \geq 0$, $(d + e) > 0$, and the relationships (27) and (28) must each be satisfied to ensure stability. However with the present invention, for the same reasons as described hereinabove with respect to the relationships (3) and (31), from practical considerations of stability the condition is also set that $b \geq \frac{1}{2}$.

As will be clear from the above description, a noise shaping requantization circuit according to the present invention satisfies the relationships (7), (8), (9) and (10) and provides a sufficiently high degree of stability in practical operation.

Improvement of the signal-to-noise ratio will be described in the following. Firstly, assuming that $e > 0$, the value of the requantized output signal $Y(z)$ is obtained from the equations (12) and (13) as follows:

$$Y(z) = X(z) + \frac{(1 - z^{-1})^4}{U(z)} \cdot N(z) \quad (39)$$

$$U(z) = 1 - (4 - b - c - d - e)z^{-1} + \quad (40)$$

$$(6 - 3b - 2c - d)z^{-2} - (4 - 3b - c)z^{-3} + (1 - b)z^{-4}$$

The equation (40) can be changed to the frequency domain by inserting the relationship (16), to obtain:

$$U(j\omega) = 1 - (4 - b - c - d - e)\cos\omega T + \quad (41)$$

$$(6 - 3b - 2c - d)\cos 2\omega T - (4 - 3b - c)\cos 3\omega T +$$

$$(1 - b)\cos 4\omega T - j\{-(4 - b - c - d - e)\sin\omega T +$$

$$(6 - 3b - 2c - d)\sin 2\omega T - (4 - 3b - c)\sin 3\omega T +$$

$$(1 - b)\sin 4\omega T\}$$

If it is assumed that the signal frequency range is the range of frequencies extending below the Nyquist frequency ($\omega_s/2$) of the original sampling frequency, then since the resampling frequency (i.e. the resampling frequency $\omega_a = 2\pi/T$) is made sufficiently high by comparison with the signal frequency range, then the value of $\omega T$ becomes an extremely small value which is close to zero, with respect to the signal frequency range that is expressed as $\omega \leq \omega_s/2$.

Hence, it can be assumed that:

$$\left.\begin{array}{c}\cos \omega T \approx \cos 2\omega T \approx \cos 3\omega T \approx \cos 4\omega T \approx 1 \\ \sin 2\omega T \approx 2\omega T \\ \sin 3\omega T \approx 3\omega T \\ \sin 4\omega T \approx 4\omega T\end{array}\right\} \quad (42)$$

By inserting the relationships (42) into the equation (41), $U(j\omega)$ can be expressed by the following equation (43):

$$U(j\omega) \approx e + j(d-e)\omega T \ldots \quad (43)$$

Within the signal frequency range expressed by $\omega \leq \omega_s/2$, the value of T (which is an extremely small value, close to zero as stated above) can be expressed as:

$$T << 1 \ldots \quad (44)$$

Since relationship (44) be assumed to hold true, the relationship (43) can be expressed as follows:

$$U(j\omega) \approx e \ldots \quad (45)$$

Thus, if only the signal frequency range expressed by $\omega \leq \omega_s/2$ is considered, then in the case for which $e > 0$, the value of the requantized output signal Y(z) (expressed by equation (39)) is equivalent to the following:

$$Y(z) = X(z) + \frac{(1-z^{-1})^4}{e} \cdot N(z) \quad (46)$$

For the case of $e = 0$, the requantized output signal Y(z) can be expressed, based on the equations (12) and (13) as:

$$Y(z) = X(z) + \frac{(1-z^{-1})^3}{W(z)} \cdot N(z) \quad (47)$$

Where $$W(z) = 1 - (3 - b - c - d)z^{-1} + \quad (48)$$
$$(3 - 2b - c)z^{-2} - (1 - b)z^{-3}$$

If the expression (16) is inserted into the equation (48), for operation in the frequency domain, then the following is obtained:

$$W(j\omega) = 1 - (3 - b - c - d)\cos \omega T + \quad (49)$$
$$(3 - 2b - c)\cos 2\omega T - (1 - b)\cos 3\omega T -$$
$$j\{-(3 - b - c - d)\sin \omega T + (3 - 2b - c)\sin 2\omega T -$$
$$(1 - b)\sin 3\omega T\}$$

Using the above equation (%b 49), and again assuming the case of $e > 0$ and the signal frequency range of $\omega \leq \omega_s/2$, then by inserting the relationship (42) into the equation (49) the following can be obtained:

$$W(j\omega) \approx d + j(c-d)\omega T \ldots \quad (50)$$

Moreover from the relationship expressed by equation (44), the following can be obtained:

$$W(j\omega) \approx d \ldots \quad (51)$$

Thus for the case of $e = 0$, the equation (47) for the requantized output signal Y(z) is equivalent to the following:

$$Y(z) = X(z) + \frac{(1-z^{-1})^3}{d} \cdot N(z) \quad (52)$$

Generalizing the equations (46) and (52), Y(z) and F(z) can be expressed as:

$$Y(z) = X(z) + F(z) \cdot N(z) \ldots \quad (53)$$

$$F(z) = \alpha \cdot (1-z^{-1})^K \ldots \quad (54)$$

In the above, $\alpha$ is a positive constant, and K is a natural number.

In addition, Y(z) and F(z) can be respectively expressed in the frequency domain based the equation (16), as:

$$Y(j\omega) = X(j\omega) + F(j\omega) \cdot N(j\omega) \ldots \quad (55)$$

$$F(j\omega) = \alpha \cdot (1 - \cos \omega T + j \sin \omega T)^K \ldots \quad (56)$$

The gain component $|F(j\omega)|$ of $F(j\omega)$ is expressed as:

$$|F(j\omega)| = \alpha \cdot 2^K \cdot \left| \sin^K \frac{\omega T}{2} \right| \quad (57)$$

This represents a differential characteristic within the frequency range of $\omega < \pi/T$. That is to say, the lower the frequency, the lower will be the amplitude of quantization noise, so that the desired noise shaping characteristic is achieved.

The maximum signal-to-noise ratio within the signal frequency range will now be derived for requantization as expressed by the equations (55) and (56). Designating the requantization frequency as $\omega_a$, the upper limit of the signal frequency range as the Nyquist frequency for the original sampling signal (i.e. $\omega_s/2$), the output step size of the requantizer as $\Delta$, then the requantized output signal Y(z) is distributed uniformly within the limits $\pm \Delta/2$. In the frequency domain, gain G is uniform (i.e. has the requisite white noise characteristic) Designating the power spectrum density as $\gamma_o$, the maximum positive value of the input digital signal X(z) will be designated as $L \cdot \Delta/2$, so that the maximum sine wave signal power Sp is obtained as:

$$Sp = \left(\frac{L\Delta}{2\sqrt{2}}\right)^2 = \frac{L^2 \Delta^2}{8} \quad (58)$$

In addition, the requantization noise power Np within the signal frequency range is obtained as:

$$Np = \int_0^{\omega_s/2} \gamma_o |F(j\omega)|^2 \, d\omega \quad (59)$$

While as is well known, the average quantization noise power $En^2$ is obtained as $$En^2 = \frac{1}{\Delta} \int_{-\Delta/2}^{\Delta/2} y^2 \, dy = \frac{\Delta^2}{12} \quad (60)$$

In addition, since the following relationship exists:

$$\int_0^{\omega_a/2} \gamma_o \, d\omega = En^2 \quad (61)$$

The spectral density $\gamma_o$ can be obtained from the equations (60), (61) as:

$$\gamma_o = \frac{\Delta^2}{6\omega_a} \quad (62)$$

In addition, $T = 2\pi/\omega_a$, and from the equation (57) for the gain $|F(j\omega)|$ of $F(j\omega)$, $|F(j\omega)|^2$ is obtained as:

$$|F(j\omega)|^2 = \alpha^2 \cdot 2^{2K} \cdot \sin^{2K}\frac{\pi\omega}{\omega_a} \quad (63)$$

Since $\omega << \omega_a$ within the signal frequency range of $\omega < \omega_s/2$, it can be assumed that:

$$\sin^{2K}\frac{\pi\omega}{\omega_a} \approx \left(\frac{\pi\omega}{\omega_a}\right)^{2k} \quad (64)$$

and hence the aforementioned equation (59) can be rewritten as follows, based on the equations (62), (63) and (64):

$$Np = \int_0^{\omega_s/2} \frac{\Delta^2}{6\omega_a} \alpha^2 \cdot 2^{2K} \cdot \left(\frac{\pi\omega}{\omega_a}\right)^{2K} d\omega$$

$$= \frac{\Delta^2 \alpha^2 \pi^{2K}}{12(2K+1)} \cdot \left(\frac{\omega_s}{\omega_a}\right)^{2K+1} \quad (65)$$

Designating the oversampling factor as m, where m is defined as:

$$\frac{\omega_a}{\omega_s} = m \quad (66)$$

the signal-to-noise ratio is obtained from the equations (58), (65) and (66) as:

$$\frac{Sp}{Np} = \frac{3L^2(2K+1)m^{2K+1}}{2\alpha^2 \cdot \pi^{2K}}, \quad (67)$$

To express the maximum signal-to-noise ratio within the signal frequency range due to requantization, in units of dB, the following is obtained:

$$\frac{S}{N} = 10 \log \frac{Sp}{Np} = 10 \log \frac{3L^2(2K+1)m^{2K+1}}{2\alpha^2 \cdot \pi^{2K}} \text{ (dB)} \quad (68)$$

The degree of improvement of the signal-to-noise ratio is obtained as follows. If requantization were to be executed, using the same requantizer without applying oversampling to the input digital signal (i.e. with $F(z) = 1, \omega_a = \omega_s$), then the requantization noise power $Np'$ within the signal frequency range is obtained as:

$$Np' = \int_0^{\omega_s/2} \gamma_o \, d\omega = \frac{\Delta^2}{12} \quad (69)$$

Using the value of signal-to-noise ratio obtained from equation (69), the degree of signal-to-noise ratio improvement is obtained by using equation (65), (66) and (69) as:

$$\frac{Sp/Np}{Sp/Np'} = \frac{Np'}{Np} = \frac{(2K+1)m^{2K+1}}{\alpha^2 \cdot \pi^{2K}} \quad (70)$$

The degree of signal-to-noise ratio improvement can be expressed in units of dB, as follows:

$$\frac{S}{N} - \frac{S}{N'} = 10 \log \frac{Np'}{Np} = 10 \log \frac{(2K+1)m^{2K+1}}{\alpha^2 \cdot \pi^{2K}} \text{ (dB)} \quad (71)$$

Furthermore, if $e = \frac{1}{2}$ with $K = 4$, in equation (46), $\alpha$ is equal to 2, and the oversampling factor m is assumed to be 32, then the degree of signal-to-noise ratio improvement that is derived from equation (71) is computed as 99.2 dB. This example further illustrated the improvement of signal-to-noise ratio that can be obtained with the present invention.

As can be clearly understood from the equations (39), (47) or (55), the values of the constants b, c, d and e have an effect only upon the requantization noise (N(z) or N(jω)) components, and do not have any effect upon the signal components (i.e. X(z) or X(jω)). That is to say, the values of the constants b, c, d and e have no effect at all on the frequency, characteristics, gain, etc. of the signal components, and hence any effects on these can be ignored when selecting the respective values for the constants b, c, d and e.

The required degree of output resolution will now be explained. From the equations (12) and (13), the difference signal $Y(z) - X(z)$ between the requantized output signal $Y(z)$ and the input digital signal $X(z)$ can be obtained as follows:

$$Y(z) - X(z) = \frac{(1-z^{-1})^4}{1 - (4-b-c-d-e)z^{-1} + (6-3b-2c-d)z^{-2} - (4-3b-c)z^{-3} + (1-b)z^{-4}} \cdot N(z) \quad (72)$$

If the equation (72) is rewritten as follows:

$$Y(z) - X(z) = \left\{1 + \sum_{i=1}^{\infty}(a_i \cdot z^{-i})\right\} \cdot N(z) \quad (73)$$

then from equation (30) the following can be obtained:

$$A(z) - X(z) = \left\{\sum_{i=1}^{\infty}(a_i \cdot z^{-i})\right\} \cdot N(z) \quad (74)$$

Designating the step size of the requantizer output as 2P, where P is an arbitrary natural number, then so long as the requantizer 4 is not driven into saturation, i.e. so long as the conversion error (quantization error N(z)) always varies within the limits ±P, then the following is true:

$$|N(z)| \leq P \ldots \quad (75)$$

Expressing the maximum absolute value of the input digital signal as $|X(z)|_{max}$ then the maximum absolute value of the input signal of the requantizer $|A(z)|_{max}$ can be expressed as follows, based on the equations (74) and (75):

$$|A(z)|_{max} < |X(z)|_{max} + \sum_{i=1}^{\infty} |a_i| \cdot P \qquad (76)$$

It should be noted that in actual practice it is unlikely that the absolute value $|N(z)|$ of the requantization error will always reach the maximum value P. Thus, the actual maximum $|A(z)|_{max}$ of the input signal to the requantizer will be smaller than the value that is given by the equation (76).

It has been found from the results of simulation that although there will be variations in value depending upon specific conditions, the absolute maximum value $|A(z)|_{max}$ of the input signal to the requantizer is approximately obtained as:

$$|A(z)|_{max} < |X(z)|_{max} + \left( 0.95 \sum_{i=1}^{4} |a_i| + 0.9 \sum_{i=5}^{8} |a_i| \, 0.95 \sum_{i=9}^{\infty} |a_i| \right) \cdot P \qquad (77)$$

By further approximating, the value of $|A(z)|_{max}$ can be expressed as follows:

$$|A(z)|_{max} < |X(z)|_{max} + 0.95 \sum_{i=1}^{8} |a_i| \cdot P \qquad (78)$$

Designating the requantizer input signal amplitude range as $[A-X]_{max1}$ for the case of the relationship (77), that amplitude range can be expressed as follows:

$$[A - X]_{max1} = \left( 0.95 \sum_{i=1}^{4} |a_i| + 0.9 \sum_{i=5}^{8} |a_i| + 0.15 \sum_{i=9}^{\infty} |a_i| \right) \cdot P \qquad (79)$$

The value that is provided by equation (79) must be used in conjunction with the level of the signal $X(z)$ in order to determine the absolute value of the requantizer input signal amplitude range. Furthermore, designating the requantizer input signal amplitude range for the case of the relationship (78) as $[A-X]_{max2}$, that amplitude range is expressed as follows:

$$[A - X]_{max2} = 0.95 \sum_{i=1}^{8} |a_i| \cdot P \qquad (80)$$

The value that is provided by equation (79) must be used in conjunction with the level of the signal $X(z)$ in order to determine the absolute value of the requantizer input signal amplitude range. Since the range of the input signal applied to the requantizer is:

$$\pm(|X(z)|_{max}+[A-X]_{max})$$

the requisite degree of output resolution (i.e. number of output steps) n which will ensure that the conversion error will be held within the range $\pm P$, is a natural number which satisfies the following conditions (81), for the case of an output step size of 2P:

$$n \geq \frac{2(|X(z)|_{max} + [A - X]_{max})}{2P} = L + \frac{[A - X]_{max}}{P} \qquad (81)$$

In the above, $|X(z)|_{max}=L \cdot P$

That is to say, the greater the value of $[A-X]_{max}$, the greater will be the required degree of output resolution. For example if it is assumed that L=4, and $[A-X]_{max}=2.5P$, then n becomes equal to 7, so that a degree of output resolution of 7 or higher will be satisfactory. It should be noted that even if there is some degree of saturation, the requantizer circuit will provide the stability and degree of resolution described above, and the desired noise shaping characteristic.

For example, in the case of a requantizer having a degree of output resolution which is such that the conversion error with respect to the maximum value of input (expressed by equation (77) or (78)) is within the range $\pm 3P$, then even if saturation occurs occasionally, it can be stated in general that recovery from the saturated condition will readily occur, in practice.

The above description has been based on the required degree of output resolution. However by appropriately selecting values of the constants b, c, d and e, with the present invention, it becomes possible to select the amplitude range $[A-X]_{max}$ of the requantizer input signal, as expressed by equation (79) or (80), to establish a smaller value for that range than has been possible with prior art methods.

Thus, with an identical degree of signal-to-noise ratio improvement being provided, it becomes possible to select either a lower degree of output resolution, or a higher degree of signal-to-noise ratio improvement with less of an improvement of the degree of output resolution.

In the above, the three characteristic features of a noise shaping requantization circuit according to the present invention have been described. In the following, the invention will be compared with prior art methods, using specific examples. It will be clear, by comparing the equations (4) and (39), (40) and by comparing the equations (4) and (47), (48) that the prior art example No. 1 described hereinabove corresponds to the configuration of a noise shaping requantization circuit according to the present invention in which the constants b, c, d and e of equations (7) to (11) have the respective values:

$$b=c=d=1, e=0 \ldots \qquad (82)$$

but with the relationship (9) not being satisfied. Moreover, the prior art example No. 2 corresponds to a noise shaping requantization circuit according to the present invention in which the constants b, c, d and e of equations (7) to (11) have the respective values:

$$b=c=d=e=1 \ldots \qquad (83)$$

but with the relationship (9) not being satisfied.

A quantitative analysis of the prior art example number 1 and prior art example No. 2 respectively can be executed by setting the values set out in equations (82), (83) above respectively into the equations that have been used for quantitative analysis of a noise shaping requantization circuit according to the present invention hereinabove.

The appended Table 1 shows computed values for each of 7 representative embodiments of the present invention, based on the operational circuit configurations of FIGS. 4 to 9, with respective values for the constants b, c, d and e, values for degree of signal-to-noise ratio improvement (in units of dB), values for Mp and Mf, and various other characteristic values described hereinabove.

The appended Table 2 similarly shows respective values for the constants b, c, d and e, values for degree of signal-to-noise ratio improvement (in units of dB), values for Mp and Mf, and various other characteristic values described hereinabove, as for Table 1, for the prior art example No. 1 and prior art example No. 2.

In computing the values which are given in Table 1 and Table 2, it has been assumed that the requantizer does not enter a state of saturation. In addition, the values for the degree of signal-to-noise ratio improvement have been obtained from equation (71) by assuming an oversampling factor of 32, and the values for Mp have been derived by assuming that the closed loop transfer gain (in equation(29)) is a maximum value. In addition, the values of Mf are for the closed loop transfer gain (equation 33) at the point v (i.e. $\omega = \pi/T$).

The values for $\sum_{i=1}^{4} |a_i|$, $\sum_{i=1}^{8} |a_i|$, and $\sum_{i=1}^{\infty} |a_i|$ are, respectively, the sum totals of the absolute values of the coefficients $a_i$ (i.e the coefficients for $z^{-i}N(z)$ as defined in equation (73) given hereinabove), for sets of values of i respectively extending from 1 to 4, from 1 to 8, and from 1 to infinity.

In Tables 1 and 2, $[A-X]_{max1}$ and $[A-X]_{max2}$ are the respective values of input signal amplitude range for the requantizer, as expressed by equations (79) and (80) respectively, and the required degree of resolution can be obtained from these. Each of these values in the tables is that by which the value P (i.e. ½ of the step size 2P)is multiplied to obtain the input signal amplitude range of the quantizer.

By comparing the numeric values shown in the tables for the representative embodiments of the present invention (in Table 1) and those given for the prior art example No. 1 and prior art example No. 2 (in Table 2), the differences between the present invention and these prior art examples can be clearly understood.

For example, if the embodiments 1 and 2 of the present invention are respectively configured such as to provide the same degree of signal-to-noise ratio improvement as that provided by the prior art example No. 1, then each of the values of Mp and $[A-X]_{max}$ that are provided by these embodiments of the present invention will be respectively smaller than the values of Mp and $[A-X]_{max}$ that are provided by the prior art example No. 1. This is due to the fact that with these embodiments 1 and 2 of the present invention, a higher degree of stability and a lower requisite degree of output resolution are achieved, by comparison with the prior art example No. 1.

Furthermore, if embodiment 3 of the present invention and the prior art example No. 2 (which provides a 4th order noise shaping characteristic) are each configured to provide an identical degree of signal-to-noise ratio improvement, then that embodiment of the present invention will be able to function with a lower degree of output resolution than the prior art example No. 2. Specifically, that embodiment of the present invention will be capable of operation with a degree of output resolution that is greater than the necessary output resolution of the prior art example 1 (having a third order noise shaping characteristic) by approximately ±1P. It can thus be understood that the embodiment 3 of the present invention can provide a fourth order noise shaping characteristic, while being capable of operating with a degree of output resolution that is substantially identical to that required by a conventional third order noise shaping requantization circuit.

Each of the embodiments 4 to 6 of the present invention can function with a lower value of output resolution than the prior art example 1, while providing a degree of signal-to-noise ratio improvement that is less than that provided by the prior art example No. 2 by only approximately 6 dB.

Moreover, in the case of embodiment 7 of the present invention, although not shown in Table 2, a degree of signal-to-noise ratio improvement is provided that is comparable to that which can be obtained by a prior art third order noise shaping requantization circuit such as the prior art example No. 1, while being capable of operation with a lower degree of output resolution than that which is necessary for a prior art second order noise shaping requantization circuit (i.e. $[A-X]_{max} = 2.85$).

In this way, with the present invention, by appropriately selecting the respective values of the constants b, c, d and e, it becomes possible to obtain a noise shaping requantization circuit which can operate with a lower degree of output resolution than is necessary with a prior art method, while obtaining an excellent degree of signal-to-noise ratio improvement.

Furthermore, as will be clear from the Tables 1 and 2, there is a strong correlation between the maximum value Mp of the closed loop transfer gain and the amplitude range $[A-X]_{max}$ of the requantizer input signal. Increasing the degree of signal)-to-noise ratio improvement, i.e. making Mp smaller, will result in a decrease of the amplitude range of the requantizer input signal, so that a reduction of the necessary output resolution can be achieved.

Determination of values for the constants b, c, d and e which will make Mp become small can be done by drawing a gain-phase characteristic diagram for a single-recursion transfer characteristic {equation (17)} within the range $0 < \omega \leq \pi/T$, on a Nichols chart.

FIGS. 4 to 9 show specific configurations for the operational circuit 3, which are applicable to the representative embodiments 1 to 7 of a noise shaping requantization circuit according to the present invention. In FIGS. 4 to 9, numerals 21 to 50 denote adders, 51 to 61 denote subtractors, 62 to 83 denote delay elements each providing a unit delay that is equal to the resampling period T.

In addition, 84 to 87 denote factor multipliers which use a factor value of ¼. Each of these can be implemented in practice as an element which executes a 2-bit shift towards the LSB (lowest significance bit) direction, then replaces the two highest-significance bits by the value of the MSB (most significant bit) prior to executing that shift. 88 to 93 denote factor multipliers which use a factor value of ½. Each of these can be implemented in practice as an element which executes a 1-bit shift towards the LSB direction, then replaces the MSB of the result by the value of the MSB prior to executing that shift. Numerals 94 to 98 denote factor multipliers which use a factor value of 2. Each of these can be implemented in practice as an element which executes a 1-bit shift in the MSB direction.

Figure 4:
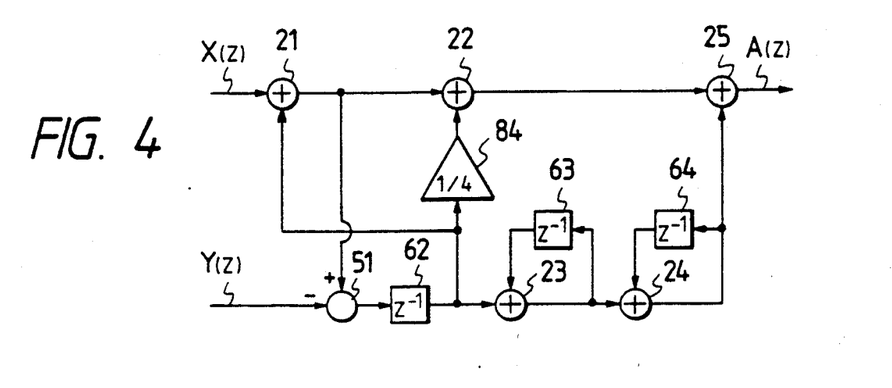
FIGS. 4 through 11 are block diagrams of representative embodiments of an operational circuit for use within a noise shaping requantization circuit according to the present invention.

The output signal A(z) from the operational circuit shown in FIG. 4 can be expressed as:

$$A(z) = X(z) + z^{-1}\left(\frac{5/4}{1-z^{-1}} + \frac{1}{(1-z^{-1})^3}\right) \cdot \{X(z) - Y(z)\}$$

The noise shaping requantization circuit of embodiment 1 of the present invention (whose characteristic values are given in column 1 of Table 1) uses the operational circuit that is shown in FIG. 4.

Figure 5:
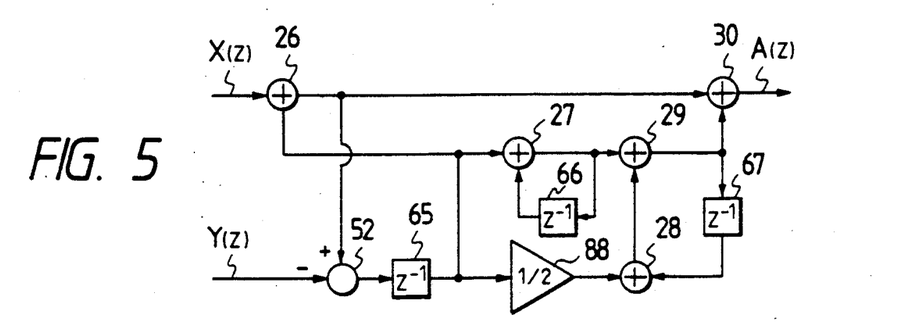

The output signal A(z) from the operational circuit shown in FIG. 5 can be expressed as:

$$A(z) = X(z) + z^{-1}\left(\frac{1}{1-z^{-1}} + \frac{1/2}{(1-z^{-1})^2} + \frac{1}{(1-z^{-1})^3}\right) \cdot \{X(z) - Y(z)\}$$

The noise shaping requantization circuit of embodiment 2 of the present invention (whose characteristic values are given in column 2 of Table 1) uses the operational circuit that is shown in FIG. 5.

Figure 6:
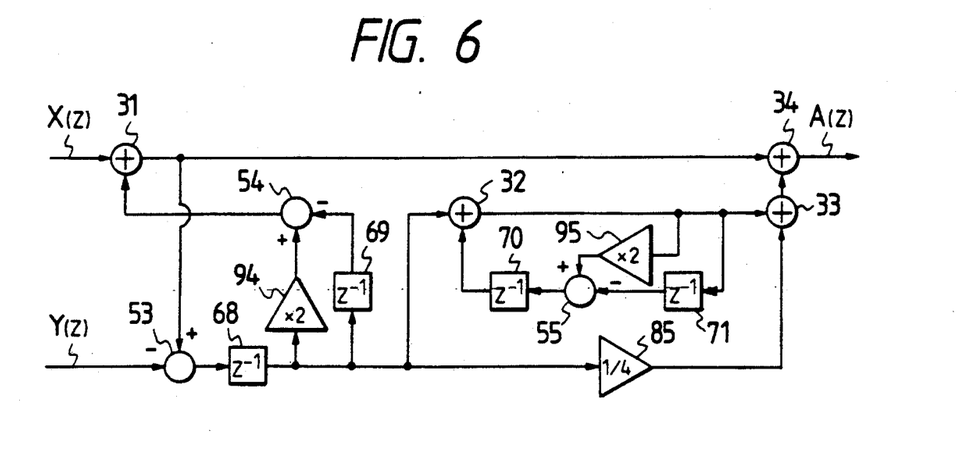

The output signal A(z) from the operational circuit shown in FIG. 6 can be expressed as:

$$A(z) = X(z) + z^{-1}\left(\frac{1}{1-z^{-1}} + \frac{5/4}{(1-z^{-1})^2} + \frac{1}{(1-z^{-1})^4}\right) \cdot \{X(z) - Y(z)\}$$

The noise shaping requantization circuit of embodiment 3 of the present invention (whose characteristic values are given in column 3 of Table 1) uses the operational circuit that is shown in FIG. 6.

Figure 7:
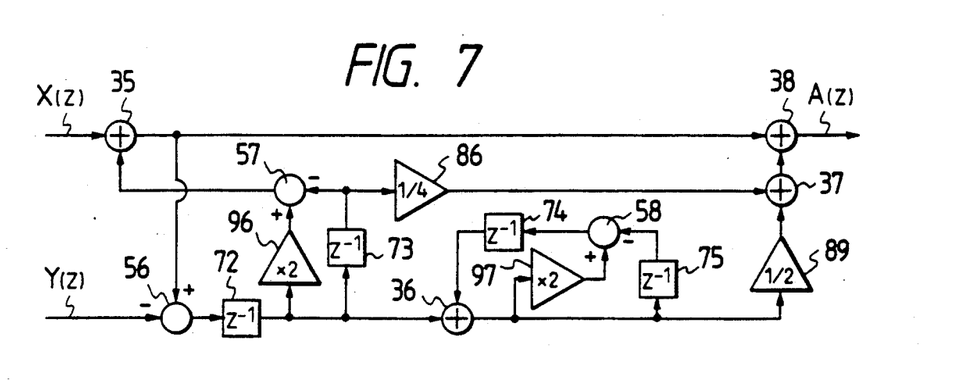

The output signal A(z) from the operational circuit shown in FIG. 7 can be expressed as:

$$A(z) = X(z) + z^{-1}\left(\frac{3/4}{1-z^{-1}} + \frac{5/4}{(1-z^{-1})^2} + \frac{1/2}{(1-z^{-1})^4}\right) \cdot \{X(z) - Y(z)\}$$

The noise shaping requantization circuit of embodiment 4 of the present invention (whose characteristic values are given in column 4 of Table 1) uses the operational circuit that is shown in FIG. 7.

Figure 8:
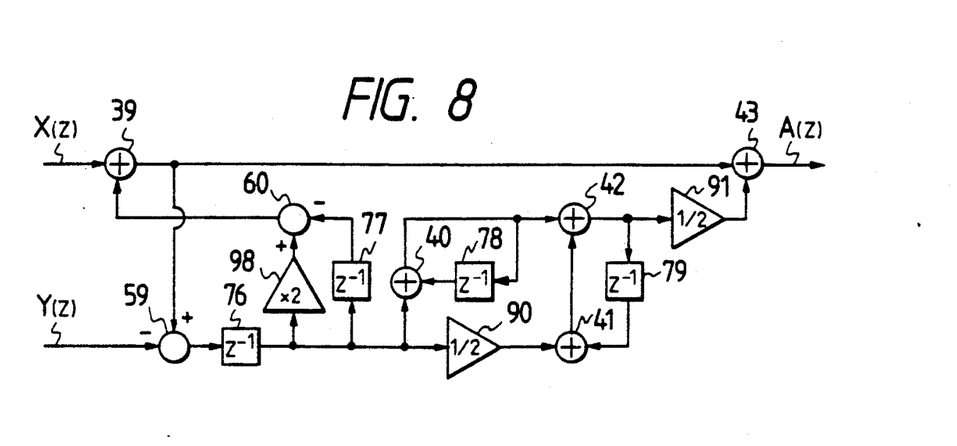

The output signal A(z) from the operational circuit shown in FIG. 8 can be expressed as:

$$A(z) = X(z) + z^{-1}\left(\frac{1}{1-z^{-1}} + \frac{1}{(1-z^{-1})^2} + \frac{1/4}{(1-z^{-1})^3} + \frac{1/2}{(1-z^{-1})^4}\right) \cdot \{X(z) - Y(z)\}$$

The noise shaping requantization circuit of embodiment 5 of the present invention (whose characteristic values are given in column 5 of Table 1) uses the operational circuit that is shown in FIG. 8.

If the operational circuit is changed such that the coefficient multiplier 90 shown in FIG. 8 is removed, with the output from the delay unit 76 being directly supplied to the input of the adder 41, then the output signal A(z) can be expressed as follows:

$$A(z) = X(z) + z^{-1}\left(\frac{1}{1-z^{-1}} + \frac{1}{(1-z^{-1})^2} + \frac{1/2}{(1-z^{-1})^3} + \frac{1/2}{(1-z^{-1})^4}\right) \cdot \{X(z) - Y(z)\}$$

This partially altered operational circuit, obtained by changing the circuit of FIG. 8, is used in embodiment 6 of a noise shaping requantization circuit according to the present invention, whose characteristic values are given in column 6 of Table 1. The indication (7) in Table 1 signifies that this embodiment has resulted from a partial alteration of the circuit of FIG. 8.

Figure 9:
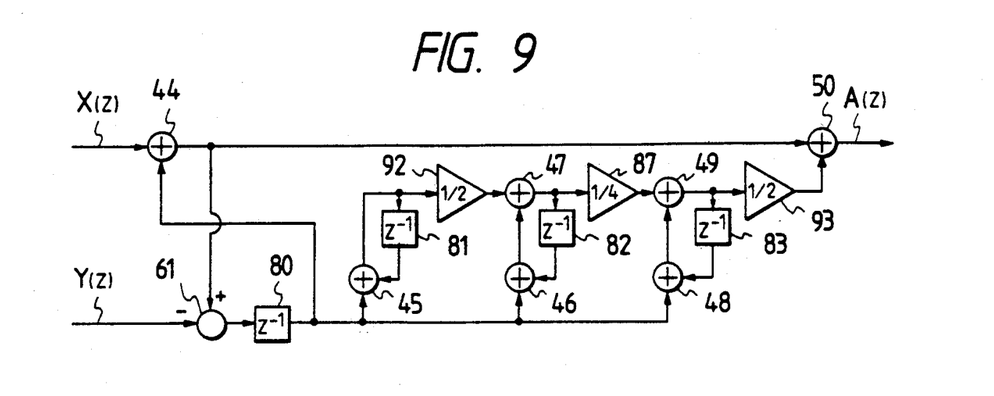

The output signal A(z) from the operational circuit shown in FIG. 9 can be expressed as:

$$A(z) = X(z) + z^{-1}\left(\frac{1}{1-z^{-1}} + \frac{1/2}{(1-z^{-1})^2} + \frac{1/8}{(1-z^{-1})^3} + \frac{1/16}{(1-z^{-1})^4}\right) \cdot \{X(z) - Y(z)\}$$

The noise shaping requantization circuit of embodiment 7 of the present invention (whose characteristic values are given in column 7 of Table 1) uses the operational circuit that is shown in FIG. 9.

It should be noted that the present invention is not limited to a noise shaping requantization circuit which uses the typical embodiments of an operational circuit according to the present invention described above, and that it would be possible to use an operational circuit configuration other than those shown in FIGS. 4 to 9 in such a noise shaping requantization circuit. It should also be noted that a noise shaping requantization circuit according to the present invention is not limited to the embodiments 1 to 7 described hereinabove, and that it would be possible to use other values for the respective constants b, c, d and e.

Figure 10:
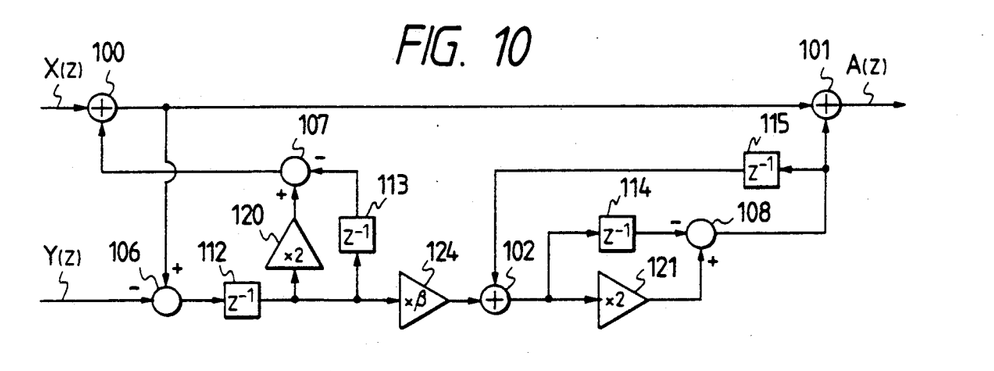
Figure 11:
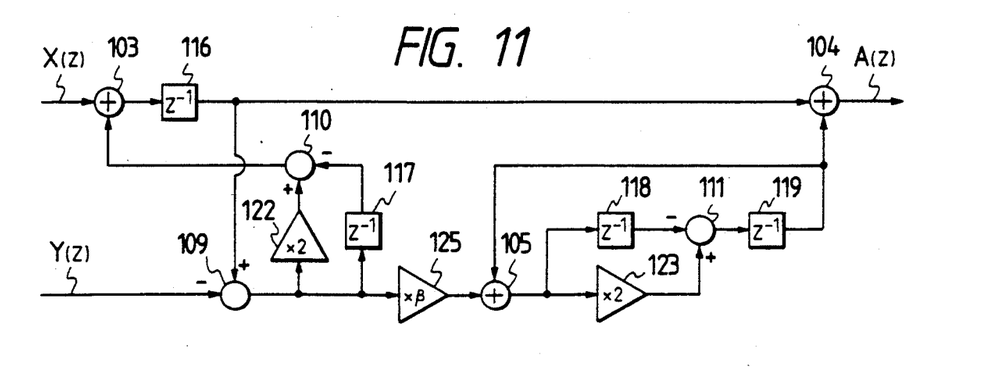

FIGS. 10 and 11 show two further embodiments of an operational circuit for a noise shaping requantization circuit according to the present invention. In FIGS. 10 and 11, 100 to 105 denote respective adders, 106 to 111 denote respective subtractors, 112 to 119 denote delay elements, 120 to 123 denote coefficient multipliers each of which multiplies by a factor 2. 124 and 125 are coefficient multipliers each of which multiplies by a factor "a", which can have a value such as ½ or ¼, etc.

The operation of these embodiments is similar to that of the embodiments of FIGS. 4 to 9 described hereinabove, so that detailed description will be omitted. The output signal A(z) from the operational circuit embodiment of FIG. 10 is expressed by the following equation:

$$A(z) = X(z) + Z^{-1}\left(\frac{1}{(1-Z^{-1})} + \frac{1}{(1-Z^{-1})^2} + \frac{\beta}{(1-Z^{-1})^3} + \frac{\beta}{(1-Z^{-1})^4}\right)\{X(z) - Y(z)\} \quad (84)$$

"B" is made equal to ½ in equation (84), then an identical output signal will be obtained from the operational circuit to that which is obtained with embodiment 6 described hereinabove, i.e. the embodiment of FIG. 10 and the embodiment 6 are mutually equivalent in that case.

The output signal A(z) from the operational circuit embodiment of FIG. 11 is expressed by the following equation:

$$A(z) = Z^{-1} \cdot X(z) + Z^{-1}\left(\frac{1}{(1-Z^{-1})} + \frac{1}{(1-Z^{-1})^2} + \frac{\beta}{(1-Z^{-1})^3} + \frac{\beta}{(1-Z^{-1})^4}\right)\{Z^{-1} \cdot X(z) - Y(z)\} \quad (85)$$

The circuit of FIG. 11 is derived from that of FIG. 10 by eliminating the delay element 112 of FIG. 10 and inserting a delay element 116 at the output from the adder 103, and by eliminating the delay element 115 and inserting a delay element 119 at the output of the subtractor 111.

As can be understood by comparing the output signals A(z) given by the equations (84) and (85) respectively, the only difference between these is that the quantity X(z) in equation (84) is replaced by the term $Z^{-1} \cdot X(z)$ in equation (85). That is to say, the circuit of FIG. 11 is completely equivalent to that of FIG. 10, except for the fact that the input digital signal X(z) is subjected to a unit delay (i.e. of one resampling period). Thus if the operational circuit of FIG. 11 is used in a noise shaping requantization circuit according to the present invention, the only difference from that of a noise shaping requantization circuit using the operational circuit of FIG. 10 is that a delay is applied to the input signal, and hence the response obtained will be identical in either case, i.e. completely identical noise shaping characteristics will be obtained irrespective of whether the operational circuit of FIG. 10 or that of FIG. 11 is used. This is true for each of the other equations of the various operational circuit embodiments described hereinabove, in each of which the term X(z) can be replaced by $Z^{-1} \cdot X(z)$.

As will be apparent from the embodiments of FIGS. (10) and (11), various modified forms of a noise shaping requantization circuit according to the present invention can be envisaged, which fall within the scope claimed for the present invention.

As described in the above, the present invention comprises a noise shaping requantization circuit for executing requantization of an input digital signal having a high degree of resolution, using a requantization frequency which is substantially higher than the original quantization frequency of that input digital signal, to thereby convert the input digital signal to a requantized output digital signal having a lower degree of resolution than the input digital signal. It can be understood from the comparisons with prior art examples given hereinabove that the method of the present invention enables a substantial improvement over the prior art, and meets the objectives set out for the invention. Specifically, by appropriately selecting respective values of the constants b, c, d and e in the expression (11) given hereinabove which expresses the output signal from the operational circuit, it is possible to improve the signal-to-noise ratio and the requisite degree of output resolution in a mutually complementary manner, such that by comparison with a prior art noise shaping requantization circuit which provides the same degree of signal-to-noise ratio improvement (with respect to a circuit which does not employ noise shaping requantization), a noise shaping requantization circuit according to the present invention can utilize a lower degree of output resolution (i.e. a greater magnitude of quantization step size). Conversely, by comparison with a prior art noise shaping requantization circuit which has the same degree of output resolution, a noise shaping requantization circuit according to the present invention can provide a greater degree of signal-to-noise ratio improvement.

TABLE 1

|  | Embodiment number | | | | | | |
|---|---|---|---|---|---|---|---|
|  | 1 | 2 | 3 | 4 | 5 | 6 | 7 |
| Constant b | 5/4 | 1 | 1 | ½ | 1 | 1 | 1 |
| Constant c | 0 | ½ | 5/4 | 5/4 | 1 | 1 | ½ |
| Constant d | 1 | 1 | 0 | 0 | ½ | ½ | ½ |
| Constant e | 0 | 0 | 1 | ½ | ½ | ½ | 1/16 |
| Degree of S/N (dB) improvement | 84 | 84 | 105.2 | 99.2 | 99.2 | 99.2 | 81.2 |
| Mp | 5.4 | 4.39 | 7 | 4.12 | 4.33 | 5.40 | 2.06 |
| Mf | 3 | 3 | 7 | 2.56 | 4.33 | 5.40 | 1.81 |
| $\sum_{i=1}^{4} \|a_i\|$ | 4.07 | 4.81 | 6.68 | 4.69 | 4.94 | 5.75 | 2.24 |
| $\sum_{i=1}^{8} \|a_i\|$ | 5.05 | 5.87 | 7.95 | 5.45 | 5.63 | 6.19 | 2.57 |
| $\sum_{i=1}^{\infty} \|a_i\|$ | 7.66 | 6.11 | 10.44 | 6.51 | 6.50 | 6.33 | 3.49 |
| $[A-X]_{max}1[P]$ | 5.14 | 5.56 | 7.86 | 5.30 | 5.44 | 5.88 | 2.56 |
| $[A-X]_{max}2[P]$ | 4.80 | 5.58 | 7.55 | 5.18 | 5.35 | 5.88 | 2.44 |
| Drawing No. of operational circuit | FIG. 4 | FIG. 5 | FIG. 6 | FIG. 7 | FIG. 8 | FIG. (8) | FIG. 9 |

TABLE 2

|  | Prior art example number | |
|---|---|---|
|  | 1 | 2 |
| Constant b | 1 | 1 |
| Constant c | 1 | 1 |
| Constant d | 1 | 1 |
| Constant e | 0 | 1 |
| Mp | 7 | 15 |
| Mf | 7 | 15 |
| Degree of S/N ratio improvement (dB) | 84 | 105.2 |

TABLE 2-continued

|  | Prior art example number | |
| --- | --- | --- |
|  | 1 | 2 |
| $\sum_{i=1}^{4} \|a_i\|$ | 7 | 15 |
| $\sum_{i=1}^{8} \|a_i\|$ | 7 | 15 |
| $\sum_{i=1}^{\infty} \|a_i\|$ | 7 | 15 |
| $[A - X]_{max}1[P]$ | 6.65 | 14.25 |
| $[A - X]_{max}2[P]$ | 6.65 | 14.25 |

What is claimed is:

1. A noise shaping requantization circuit for converting an input digital signal, which has a high degree of resolution and has been generated using an original sampling frequency, to a requantized output digital signal having a lower degree of resolution that the input digital signal by using a resampling frequency that is higher than the original sampling frequency, comprising:

input terminal means (1) coupled to receive said input digital signal;

operational circuit means (3) coupled to receive said input digital signal from said input terminal means to produce an output signal;

output terminal means (2); and quantizer circuit means (4) coupled to receive said output signal from said operational circuit means for producing said requantized output digital signal and for supplying said requantized output signal to said output terminal means and to said operational circuit means for producing an output signal A(z) from said operational circuit means;

wherein, respectively expressing said input digital signal as X(z), said requantized output digital signal as Y(z), said output signal from said operational circuit means as A(z), and a unit delay time corresponding to a resampling period as $z^{-1}$, the signal A(z) is expressed as follows:

$$X(z) + z^{-1}\left\{ \frac{b}{1-z^{-1}} + \frac{c}{(1-z^{-1})^2} + \frac{d}{(1-z^{-1})^3} + \frac{e}{(1-z^{-1})^4} \right\} \{X(z) - Y(z)\}$$

where respective constants b, c, d and e simultaneously satisfy all of the following relationships:

$b \geq \frac{1}{2}, e \geq 0, d+e > 0$
$b(d+e)(c+d+e) - b^2 e - 1.2(d+e)^2 > 0$
$8b + 4c + 2d + e < 15$
$8b + 4c + 2d < 14 + e.$ 2. A noise shaping requantization circuit for converting an input digital signal, which has a high degree of resolution and has been generated using an original sampling frequency, to a requantized output digital signal having a lower degree of resolution than the input digital signal by using a resampling frequency that is higher than the original sampling frequency, comprising:

input terminal means (1) coupled to receive said input digital signal;

operational circuit means (3) coupled to receive said input digital signal from said input terminal, to produce an output signal;

output terminal means (2); and quantizer circuit means (4) coupled to receive said output signal from said operational circuit means, for producing said requantized output digital signal and for supplying said requantized output signal to said output terminal means and to said operational circuit means for producing an output signal A(z) from said operational circuit means;

wherein, respectively expressing said input digital signal as X(z), said requantized output digital signal as Y(z), said output signal from said operational circuit means as A(z), and a unit delay time corresponding to a resampling period as $z^{-1}$, the signal A(z) is expressed as follows:

$$z^{-1} \cdot X(z) + z^{-1}\left\{ \frac{b}{1-z^{-1}} + \frac{c}{(1-z^{-1})^2} + \frac{d}{(1-z^{-1})^3} + \frac{e}{(1-z^{-1})^4} \right\} \{z^{-1} \cdot X(z) - Y(z)\}$$

where respective constants b, c, d and e simultaneously satisfy all of the following relationships:

$b \geq \frac{1}{2}, e \geq 0, d+e > 0$
$b(d+e)(c+d+e) - b^2 e - 1.2(d+e)^2 > 0$
$8b + 4c + 2d + e < 15$
$8b + 4c + 2d < 14 + e.$

* * * * *